(12) United States Patent
Lin et al.

(10) Patent No.: US 6,212,002 B1
(45) Date of Patent: Apr. 3, 2001

(54) OPTICAL AMPLIFIER

(75) Inventors: Wen-Chin Lin, Hsinchu; Ying-Tso Lin, Hsinchu Hsien; Lih-Gen Sheu, Taoyuan Hsien, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/329,109

(22) Filed: Jun. 9, 1999

(51) Int. Cl.⁷ ...................................................... H01S 3/00
(52) U.S. Cl. ........................ 359/341; 359/344; 359/337
(58) Field of Search .................................. 359/341, 344, 359/333, 337

(56) References Cited

U.S. PATENT DOCUMENTS

| | | |
|---|---|---|
| 5,233,463 | 8/1993 | Grasso et al. |
| 5,280,383 | 1/1994 | Federici. |
| 5,283,686 | 2/1994 | Huber. |
| 5,566,018 * | 10/1996 | Lee et al. ............................ 359/341 |
| 6,011,845 * | 1/2000 | Hong .................................. 359/341 |

FOREIGN PATENT DOCUMENTS

2246234 * 1/1992 (GB).

* cited by examiner

Primary Examiner—Mark Hellner
(74) Attorney, Agent, or Firm—Jiawei Huang; J C Patents

(57) ABSTRACT

The invention provides an optical amplifying system having a structure with two amplification levels to amplify received optical signals. The optical amplifying system includes a Michelson interferometer, a preamplifier, and a post amplifier. In the preamplifier and the post-amplifier, respectively have a light pumping source, a wavelength multiplexer, and an optical gain media. The Michelson interferometer includes an optical coupler and an optical grating set composed of a pair of optical gratings. The optical gratings are located different optical passes, and its central wavelength is equal to the intended wavelength. The optical grating can be formed on a piezoelectric substrate or an electrothermal substrate so that the central wavelength can be changed by applying stress or heat. The intended wavelength reflected by the Michelson interferometer can therefore be adjusted. The preamplifier and the post-amplifier are coupled together through the optical coupler of the Michelson interferometer. Furthermore, an isolator can also be coupled between the preamplifier and the Michelson interferometer so as to avoid the backward propagation noise.

21 Claims, 5 Drawing Sheets

OPTICAL AMPLIFIER

BACKGROUND OF THE INVENTION

1. Field of Invention

The present invention relates to an optical amplifier. More particularly, the present invention relates to an optical amplifier of Michelson interferometer.

2. Description of Related Art

Typically, an optical fiber amplifier uses an erbium doped fiber (EDF) or other active fiber as a gain media. A semiconductor laser light source is also used to excite electrons from a lower energy level to a higher energy level as a pumping function. As an initial optical signal passes through the optical amplifier, it triggers the excited electrons to drop to its lower energy level through radiate photons, resulting in a stimulated emission. The optical signal therefore is amplified.

However, as the optical signal is amplified, a spontaneous emission, resulting in noise, does also simultaneously occur. The noise is also amplified by the optical amplifier to form an amplified spontaneous emission (ASE) noise and propagates along with the optical signal. The ASE noise not only reduces the light pumping efficiency, but also reduce a signal-to-noise ratio (SNR). As a result, the performance of the optical amplifier is degraded, and the communication quality is then deteriorated. It becomes a key point necessarily to be considered during designing the optical amplifier to suppress the ASE noise and increase an optical gain.

A U.S. Pat. No. 5,233,463 by Pirelli S.P.A. company (Italy) disclosed an optical amplifier using a two-level structure. Between the preamplifier and the post-amplifier, an optical isolator is added so as to isolate the ASE noise from the post-amplifier propagating in an opposite direction to the preamplifier. The preamplifier therefore can have greater optical gain, resulting in a better performance of the whole optical amplifier. However, the ASE noise originated from the preamplifier itself, which also includes optical fiber, is also amplified in the post amplifier. The performance in this manner is not at the best mode.

A U.S. Pat. No. 5,280,383 by AT&T Bell Lab. Disclosed another optical amplifier, which adds a filter after the isolator so as to filter away the ASE noise with a wavelength other than the desired wavelength used in communication. The filters only allows the light having the desired wavelength to pass and enter the post amplifier. Even though this manner can reduce the ASE noise, it also causes a large amount of insertion loss (IL). The transmission quality of the optical signal is greatly affected. Moreover, it is difficult to fabricate a filter with multiple windows. The solution with filter is not suitable for use in a communication system with multiple wavelengths.

A U.S. Pat. No. 5,283,686 by General Instrument Corp. disclosed an optical circulator and a fiber grating to reduce an accumulating rate of the ASE noise. The amplified optical signals and the ASE noise can simultaneously propagate to the fiber grating through the optical circulator. The fiber grating has a central wavelength, which is equal to the desired wavelength. The incident amplified optical signals are reflected by the fiber grating and are exported by the optical circulator at the other end, while the ASE noise will travel through the fiber grating. Therefore, the ASE is filtered out. The transmission quality of the optical signals remains without affection. However, the optical circulator is very expensive. It causes a great increase of fabrication cost. Moreover, the IL effect is still large. This is also not a good solution to improve the communication quality.

As previously mentioned, during the optical amplification process, the optical signals and the noise are amplified at the same time. The ASE noise can also propagate along with the amplified optical signals, resulting in a severe issue of the optical communication. The ASE noise not only reduce the efficiency, but also may cause communication error.

SUMMARY OF THE INVENTION

It is at least an objective to provide an optical amplifier using Michelson interferometer so as to perform band-pass filtering on an intended wavelength so that the ASE noise with wavelengths other than the intended wavelength is automatically filtered away. The optical pumping efficiency and optical gain are effectively improved, and the SNR is also greatly increased. Moreover, when the amplifier is used for a system with multiple wavelengths, the Michelson interferometer can also performs band-pass filtering on multiple wavelengths so as to effectively improved the optical gain and suppress the ASE noise. The SNR is therefore increased for each intended wavelength.

The invention provides an optical amplifying system having a structure with two amplification levels to amplify received optical signals. The optical amplifying system includes a Michelson interferometer, a preamplifier, and a post amplifier. In the preamplifier and the post-amplifier, respectively have a light pumping source, a wavelength multiplexer, and an optical gain media. The Michelson interferometer includes an optical coupler and an optical grating set composed of a pair of optical gratings. The optical gratings are located different optical passes, and its central wavelength is equal to the intended wavelength. The optical grating can be formed on a piezoelectric substrate or an electrothermal substrate so that the central wavelength can be changed by applying stress or heat. The intended wavelength reflected by the Michelson interferometer can therefore be adjusted. The preamplifier and the post-amplifier are coupled together through the optical coupler of the Michelson interferometer. Furthermore, an isolator can also be coupled between the preamplifier and the Michelson interferometer so as to avoid the backward-propagation noise.

As the preamplifier receives the optical signals, the preamplifier amplifies the optical signals and exports the pre-amplified optical signals to the optical coupler through a optical pass, such as an optical fiber. The optical coupler divides the optical signals into a first optical signal and a second optical signal, both of which respectively propagate to the pair of the optical gratings. The pair of the optical gratings filters the noise away and reflects the first optical signal and the second signal back to the optical coupler, which further performs a construction interference between the reflected optical signals. The first optical signal and the second optical signal are then combined into a third optical signal without ASE noise. The third optical signal continuously propagates to the post amplifier for amplification.

As embodied and broadly described herein, the invention provides the optical amplifying system with the Michelson interferometer so that the optical gain is improved, the ASE noise is effectively suppressed. The SNR is effectively improved. Moreover, the fabrication cost remains low. Furthermore, the optical amplifying system of the invention can also be efficiently used in a system with multiple wavelengths.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The invention provides an optical amplifying system using Michelson interferometer so as to perform band-pass filtering on an intended wavelength so that the ASE noise with wavelengths other than the intended wavelength is automatically filtered away. The optical pumping efficiency and optical gain are effectively improved, and the SNR is also greatly increased. Moreover, when the amplifier is used for a system with multiple wavelengths, the Michelson interferometer can also performs band-pass filtering on multiple wavelengths so as to effectively improved the optical gain and suppress the ASE noise. The SNR is therefore increased for each intended wavelength. Several preferred embodiments in accordance with at least the above purposes are described in the following.

EXAMPLE 1

Figure 1:
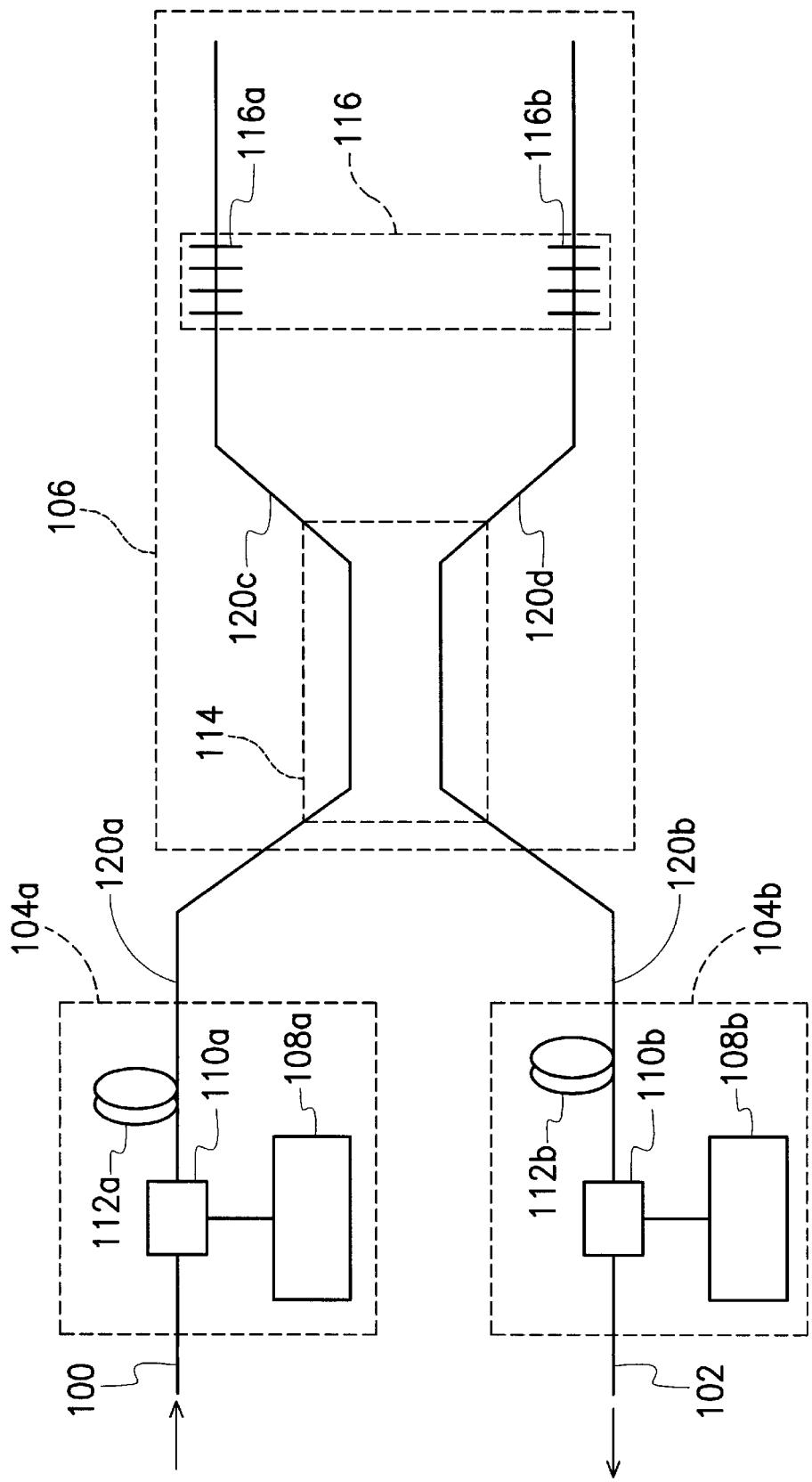
FIG. 1 is a block diagram, schematically illustrating a structure of an optical amplifying system, according to a first preferred embodiment of the invention.

FIG. 1 is a block diagram, schematically illustrating a structure of an optical amplifying system, according to a first preferred embodiment of the invention. In FIG. 1, the optical amplifying system includes an input end 100 and an output end 102, a preamplifier 104a, a post-amplifier 104b, and a Michelson interferometer 106. The preamplifier 104a is coupled to the Michelson interferometer 106 through an optical path 120a, such as an optical fiber, so that the preamplifier 104a receives optical signals from the input end 100 and exports the pre-amplified optical signals to the Michelson interferometer 106. The post-amplifier 104b is also coupled to the Michelson interferometer 106 through an optical path 120b, such as an optical fiber, so that the post-amplifier 104b can receive optical signals from the Michelson interferometer 106 and exports the post-amplified optical signals to the output end 102 through the optical path 120b.

The preamplifier 104a includes an optical pumping source 108a, a wavelength division multiplexer (WDM) 110a, and a optical gain media 112a. The optical pumping source 108a is coupled to the optical gain media 112a through the WDM 110a. The optical pumping source 108a can excite electrons from lower energy levels to higher energy levels in the optical gain media 112a. The optical gain media 112a includes, for example, an erbium doped fiber (EDF) or other active fibers. The optical pumping source 108a includes, for example, a semiconductor laser source with a wavelength of 980 nanometer (nm) or 1480 nm. As the optical signals enter the preamplifier 104a from the input end 100, the optical signals are amplified by the optical gain media 112a. The pre-amplified optical signals are exported to the Michelson interferometer 106 through the optical path 120a.

The Michelson interferometer 106 includes an optical coupler 114, a first optical path 120c, a second optical path 120d, and an optical grating set 116. The first and second optical paths 120c, 120d each includes optical fiber. The optical coupler 114 is used to connect the optical paths 120a, 120b, 120c, and 120d. The optical coupler 114 includes, for example, a 2×2 optical coupler, which has a capability of, for example, 3 dB for reducing rate of 50% so that an incident signal can be divided into two with equal portion.

As the optical coupler 114 receives the optical signals from the preamplifier 104a, it divides each optical signal into two portions, which respectively are fed into the first optical path 120c and the second optical path 120d. The optical grating set 116 includes a first optical grating 116a and a second optical grating 116b. The first optical path 120c and the second optical path 120d respectively pass the first optical grating 116a and the second optical grating 116b so that the optical grating set 116 separately receives the two portions of the optical signal from the optical coupler 114. The first optical grating 116a is identical to the second optical grating 116b, each of which includes, for example, a fiber grating. The central wavelength of the gratings 116a, 116b is set to the intended wavelength, which is employed for use in, for example, communication. Thereby, the gratings 116a, 116b can reflect the incident optical signal, which has wavelength equal to the intended wavelength. The ASE noise signals, which usually have wavelength off the central wavelength, do continuously travels through the gratings 116a, 116b and leave the optical amplifying system from the ends of the optical paths 120c, 120d. The gratings 116a and 116b therefore perform as a filter to filter the ASE noise away from the actual signals in use for communication. The reflected optical signals from the optical grating set 116 then propagate back the optical coupler 114 through the optical path 120c and 120d, and interfere to each other so that a construction interference occurs. The reflected optical signals include no noise.

After the construction interference a pure optical signal without ASE noise from the preamplifier 104a is received by the post-amplifier 104b through the optical path 120b. The post-amplifier 104b performs like the preamplifier 104a to amplify the optical signal and export the post-amplified signal to the output end 102. The post-amplifier 104b includes a optical pumping source 108b, WDM 110b, and optical gain media 112b, which have similar function to those in the preamplifier 104a. Moreover, the Michelson interferometer 106 can also prevent the ASE noise induced by the post-amplifier from propagating backwardly into the preamplifier 104a.

EXAMPLE 2

Figure 2:
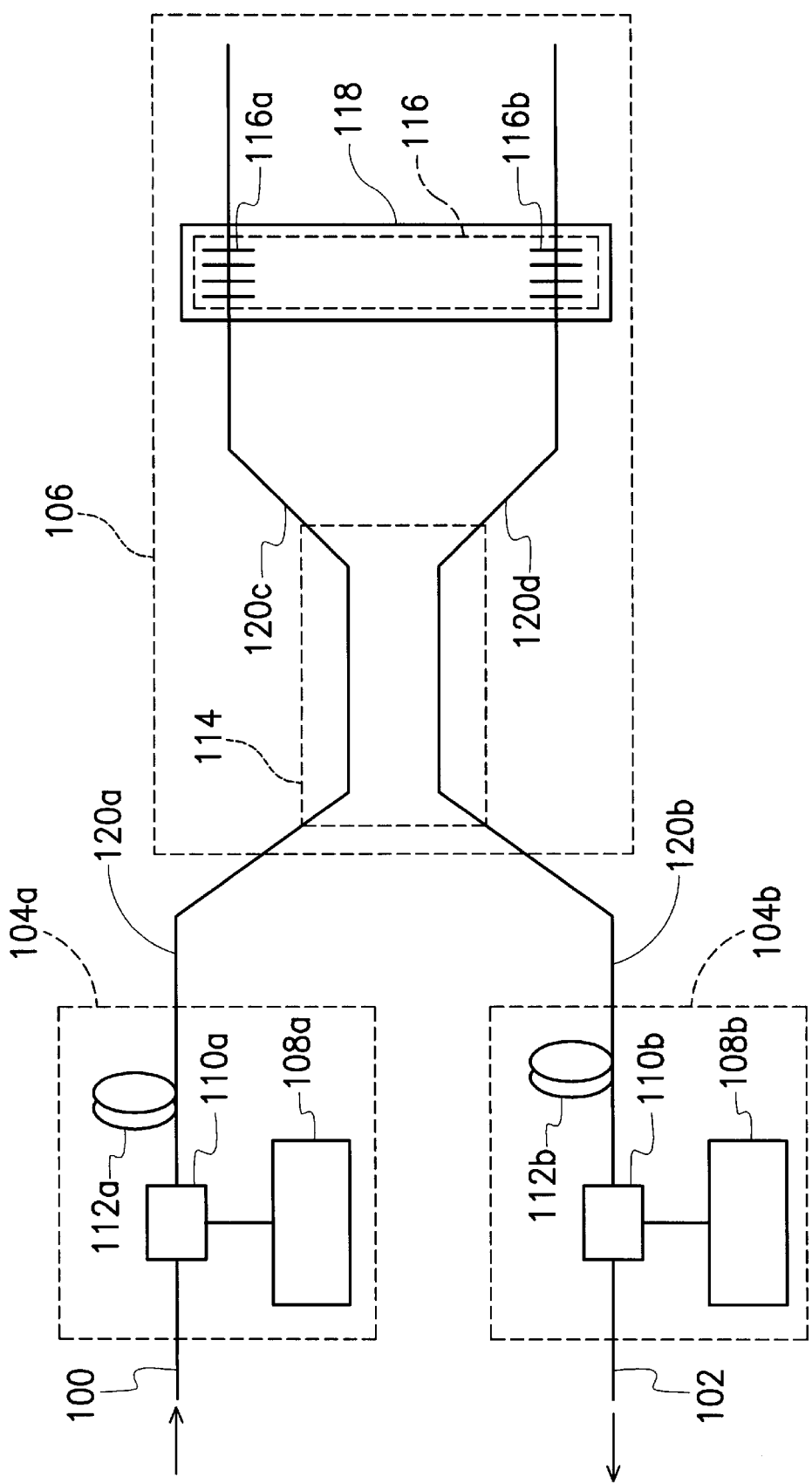
FIG. 2 is a block diagram, schematically illustrating a structure of an optical amplifying system, according to a second preferred embodiment of the invention.

FIG. 2 is a block diagram, schematically illustrating a structure of an optical amplifying system, according to a second preferred embodiment of the invention. In FIG. 2, the optical amplifying system is similar to that in FIG. 1. The like reference numeral represents the same subject. The difference is that the optical grating set 116 is formed by fiber grating, which is formed on a substrate 118. The substrate 118 includes piezoelectric (PZT) material or electrothermal material so that the central wavelength of the gratings 116a, 116b can be adjusted by applying a stress or a thermal effect on the substrate 118. As a result, the Michelson interferometer 106 can dynamically reflect the employed wavelength. This particularly suits for use in a communication system with varying wavelengths. Once the employed wavelength shifts, the gratings 116a, 116b can be accordingly adjusted.

EXAMPLE 3

Figure 3:
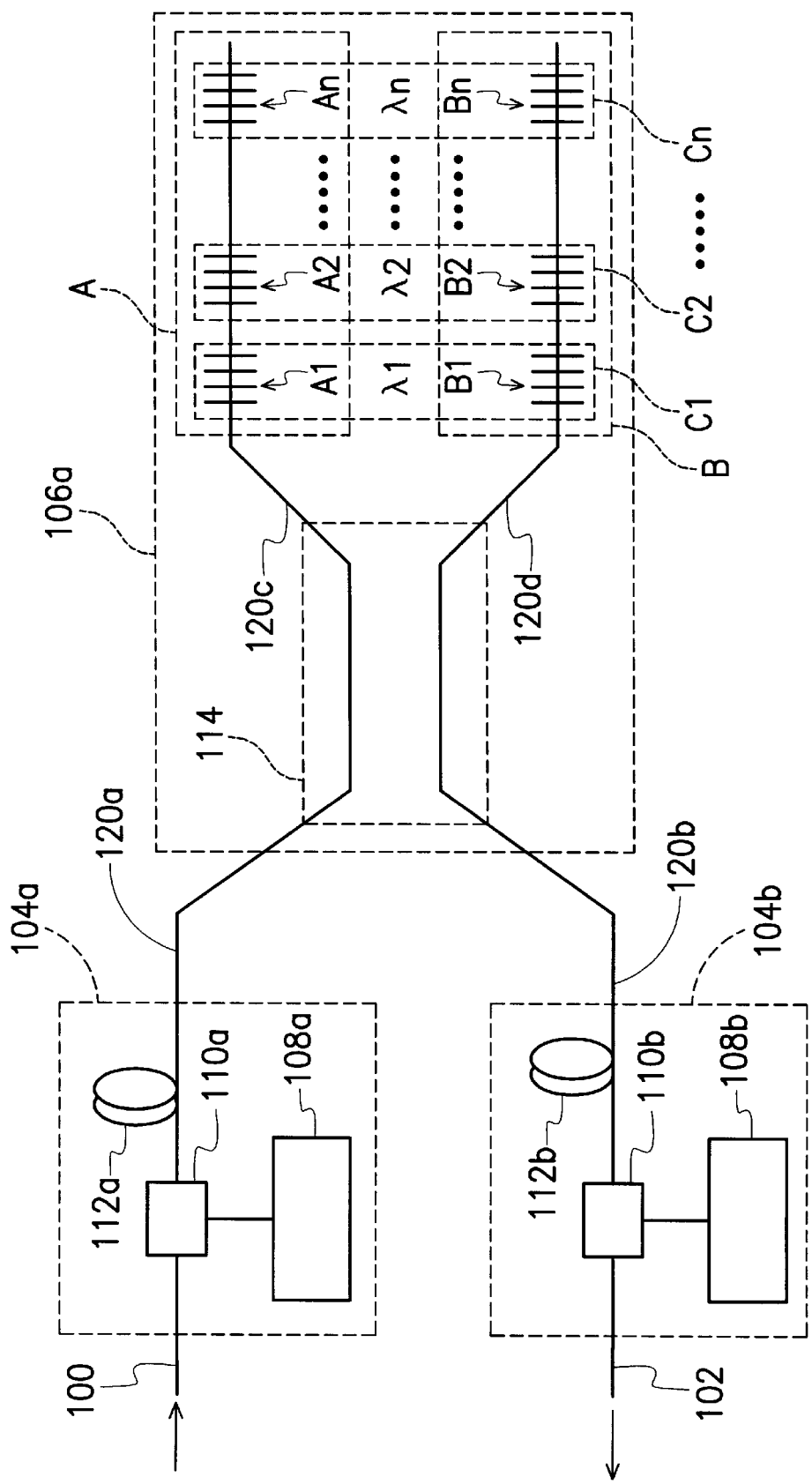
FIG. 3 is a block diagram, schematically illustrating a structure of an optical amplifying system, according to a third preferred embodiment of the invention.

FIG. 3 is a block diagram, schematically illustrating a structure of an optical amplifying system, according to a third preferred embodiment of the invention. In FIG. 3, the like reference numeral represents the same subject. The optical amplifying system of FIG. 3 is similar to those in FIGS. 1 and 2 but the grating set is different. A Michelson interferometer 106a include the optical coupler 114 and several pairs of the optical gratings C1-Cn. Each pair Ci of the optical gratings C1-Cn includes an optical grating Ai and an optical grating Bi, i=1, 2, . . . n. Each pair Ci of the optical grating C1-Cn also has a central wavelength $\lambda i$. In this manner, there are n wavelengths $\lambda 1$-$\lambda n$ with different quantities. Each pair Ci only reflects a specified wavelength $\lambda i$ and let the rest signals pass.

In the structure of FIG. 3, the optical amplifying system is suitable for n different employed wavelengths without additional adjusting on the gratings A1-An, B1-Bn. The ASE noise is filtered away and leaves the optical amplifying system from the ends of the optical paths 120c, 120d. The reflected optical signals has construction interference at the optical coupler 114 to recombination into one. The post-amplifier 104b amplifies the optical signals and exports to the output end. The amplification mechanism is the same as those described in FIG. 1.

EXAMPLE 4

Figure 4:
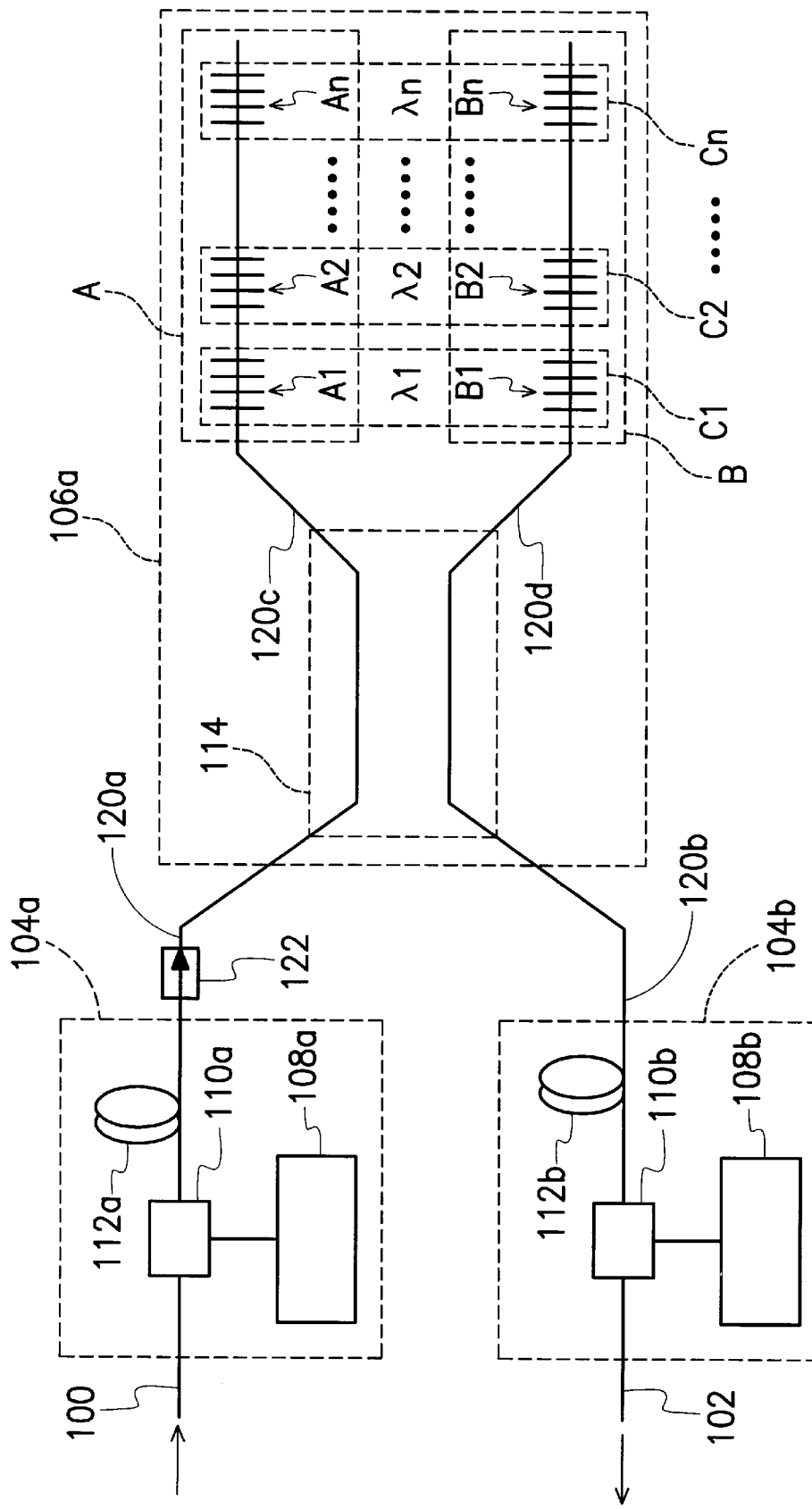
FIG. 4 is a block diagram, schematically illustrating a structure of an optical amplifying system, according to a fourth preferred embodiment of the invention.

FIG. 4 is a block diagram, schematically illustrating a structure of an optical amplifying system, according to a fourth preferred embodiment of the invention. In FIG. 4, the optical amplifying system is similar to the previous optical amplifying systems in FIGS. 1–3. The like reference numeral represents the same subject. An isolator 122 is further included into the optical amplifying system in FIG. 3. The isolator 122 is located on the optical path 120a between the preamplifier 104a and the optical coupler 114 in the Michelson interferometer 106a. The isolator 122 is used to prevent the ASE noise from entering the preamplifier 104a, in which the ASE noise may come from a residue from the Michelson interferometer 106a or the post-amplifier 104b propagating backward. The isolator 122 is also possible to be implemented into the optical amplifying systems in FIGS. 1 and 2 at the same location, if isolator is desired.

EXAMPLE 5

Figure 5:
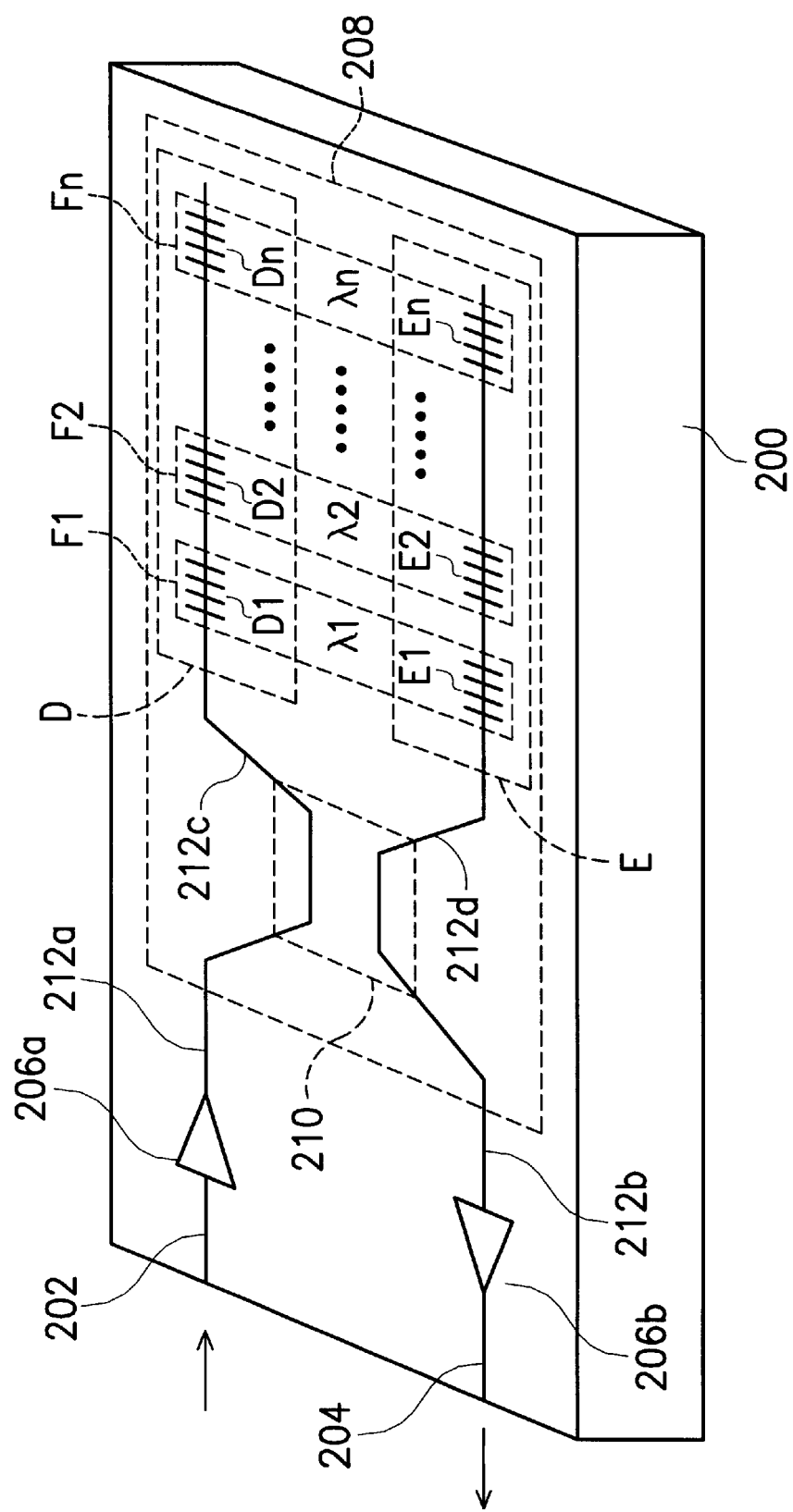
FIG. 5 is a block diagram, schematically illustrating a structure of an optical amplifying system, according to a fifth preferred embodiment of the invention.

The previous optical amplifying systems described in FIG. 3 can also further be applied in a semiconductor optical amplifier (SOA) so as to improve its optical gain and SNR. The optical amplifying systems can also be used in a system with multiple wavelengths, such as a communication system. An application on the SOA is shown in FIG. 5, which is a block diagram, schematically illustrating a structure of an optical amplifying system, according to a fifth preferred embodiment of the invention. In FIG. 5, the optical amplifying system like the one of FIG. 3 is formed on a semiconductor substrate 200, such as a silicon substrate.

The SOA includes a Michelson interferometer 208 includes an optical coupler 210 and several pairs of the gratings F1-Fn. Each pair Fi of gratings includes two identical gratings Di and Ei, i=1,2, . . . ,n, in which the gratings D1-Dn form a first grating set D and the gratings E1-En form a second grating set E. Each pair Fi also has a specified central wavelength so that there are n different central wavelengths in this manner. The functions of the optical coupler 210 and the grating pairs F1-Fn are the same as previous descriptions. The optical paths 212c and 212d are respectively used to connect the optical coupler 210 with the first grating set D and the second grating set E.

The SOA further includes a preamplifier 206a and a post-amplifier 206b. The preamplifier 206a is coupled between the input end 202 and the optical coupler 210 in the Michelson interferometer 208. An optical path 212a, such as an EDF or other optical fiber, is used for coupling. Similarly, an optical path 212b is used for connecting the post-amplifier 206b to the optical coupler 210. The post-amplifier 206b exports amplified signals to the output end 204. The optical coupler 210 is a 2×2 coupler with 3 dB reduction (50%) so that the input optical signal from the preamplifier 206a is divided into two equal portions, which respectively propagates into the first grating set D and the second grating set E through the optical paths 212c and 212d. The first grating set D and the second grating set E only reflect the wavelength $\lambda i$ and let other wavelength pass. The ASE noise is thereby filtered away and dumped through the ends of the optical paths 212c and 212d after the grating sets E,D.

The two reflected portions of the optical signal essentially includes no ASE induced by the preamplifier 206a and do a construction interference at the optical coupler 210. The result optical is fed to the post amplifier 296b for post amplification. The amplified optical signal is exported to the output end.

The properties of the invention remains the same. The ASE noise is effectively suppressed. The optical gain and the SNR is greatly improved. Amplifier performance is improved.

A comparison between those in patents and the present invention is shown in Table 1, which indicates the invention has better performance according to the structure of the invention.

TABLE 1

| Item Type | U.S. Patent 5,233,463 Isolator | U.S. Patent 5,280,383 Isolator and Wide-Band-Pass filter | Isolator and Narrow-Band-Pass filter | U.S. Patent 5,283,686 Optical circulator and fiber grating | Present Invention Isolator and Michelson interferometer |
|---|---|---|---|---|---|
| Insertion loss (dB) | 0.6 | 0.6 and 1 | 0.6 and 1 | 2 × 0.7 and 0.2 | 0.6 and 0.5 |
| ASE bandwidth | 40 nm | 20 nm | <1.2 nm | <1.2 nm | <1.2 nm |
| Multiple $\lambda$'s | Yes | Yes | No | Yes | Yes |

In conclusion, the invention has several advantages as follows:
1. The optical amplifying system includes the pre-EDFA, the post-EDFA and the Michelson interferometer. The ASE noise is efficiently filtered away by the Michelson interferometer. The optical gain and the SNR are effectively improved.

2. Comparing with the band-pass filter or the optical circulator, the Michelson interferometer has less insertion loss.
3. The gratings are formed on the piezoelectric substrate or electrothermal substrate so that the central wavelength of the gratings is dynamically adjustable. In accordance with the variation of the employed wavelength. The system has much wider tolerance.
4. The invention uses multiple pairs of gratings so as to automatically and effectively filter multiple employed wavelengths. The band width is effectively increased. In the convention one, only one band-pass filter is used, the conventional cannot effectively filter the ASE noise.
5. The Michelson interferometer associates with the WDM can adapt various wavelengths to perform filtering function and reflect the optical signal to the post-amplifier for amplification. The Michelson interferometer can also prevent the ASE induced by the post amplifier from propagating backwardly to the pre-amplifier.
6. The Michelson interferometer can be fabricated in a semiconductor fabrication so that the repetition is sufficiently good, resulting in a possibility of massive production. Fabrication cost is also low. The Michelson interferometer is also suitable for use in semiconductor amplifier.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical amplifying system comprising:
    a preamplifier further comprising:
        a pre wavelength division multiplexer (WDM), used to receive an optical signal;
        a pre optical gain media, coupled to the pre WDM and used to provide an optical gain of the optical signal; and
        a pre optical pumping source, coupled to the pre WDM and used to pump the optical gain of the optical gain media by exciting electrons from a lower energy level to a higher energy level;
    a Michelson interferometer (MI), coupled to the preamplifier so as to filter an amplified spontaneous emission (ASE) noise induced by the preamplifier and reflect the incident optical signal to a post amplifier, wherein a construction interference also occurs as the optical signal is reflected; and
    the post amplifier further comprising:
        a post optical gain media, coupled to the MI and used for post amplifying the reflected optical signal;
        a post WDM, coupled to the post optical gain media so as to receive the used the reflected optical signal after post amplification and export the optical signal;
        a post optical pumping source, coupled to the post WDM and used to pump an optical gain of the post optical gain media by exciting electrons from a lower energy level to a higher energy level.

2. The optical amplifying system of claim 1, wherein the MI further comprises:
    a 2×2 optical coupler, coupled to the pre amplifier and the post amplifier so as to receive the original optical signal and export the optical signal to the post amplifier after noise filtering and the construction interference; and
    an optical grating set, comprising at least one first grating and at least one second grating respectively coupled to the optical coupler through a first optical path and a second optical path; wherein
    the optical coupler divides the optical signal into two portions that are respectively transmitted to the first and second gratings, and the first grating and the second grating comprises a central wavelength substantially equal to an employed wavelength in the system so as to at least filter the ASE noise away and reflect the two portions of the optical signal back to the optical coupler for the construction interference thereon.

3. The optical amplifying system of claim 2, wherein the first path and the second path comprise an optical fiber.

4. The optical amplifying system of claim 2, wherein the first optical grating and the second optical grating are located on a substrate.

5. The optical amplifying system of claim 4, wherein the substrate comprises a piezoelectric substrate.

6. The optical amplifying system of claim 4, wherein the substrate comprises an electrothermal substrate.

7. The optical amplifying system of claim 1, wherein the MI further comprises:
    a 2×2 optical coupler, coupled to the pre amplifier and the post amplifier so as to receive the original optical signal and export the optical signal to the post amplifier after noise filtering and the construction interference; and
    a plurality of pairs of optical grating sets, in which each pair of the optical gratings comprises a first grating and a second grating respectively coupled to the optical coupler through a first optical path and a second optical path, wherein
    the optical coupler divides the optical signal into two portions that are respectively transmitted to the first and second gratings, and the first grating and the second grating comprises an individual central wavelength for each pair so as to at least filter the ASE noise away and reflect the two portions of the optical signal back to the optical coupler for the construction interference thereon.

8. The optical amplifying system of claim 2, wherein the first path and the second path comprise an optical fiber for couplings.

9. The optical amplifying system of claim 1, wherein the system further comprises an isolator between the Mi and the pre amplifier.

10. The optical amplifying system of claim 1, wherein the pre optical gain media in the pre amplifier comprises erbium doped fiber (EDF) or other active fiber.

11. The optical amplifying system of claim 1, wherein the post optical gain media in the post amplifier comprises erbium doped fiber (EDF) or other active fiber.

12. The optical amplifying system of claim 1, wherein the pre optical pumping source in the pre amplifier comprises a laser light with a wavelength of about 980 nm.

13. The optical amplifying system of claim 1, wherein the pre optical pumping source in the pre amplifier comprises a laser light with a wavelength of about 1480 nm.

14. The optical amplifying system of claim 1, wherein the post optical pumping source in the post amplifier comprises a laser light with a wavelength of about 980 nm.

15. The optical amplifying system of claim 1, wherein the post optical pumping source in the post amplifier comprises a laser light with a wavelength of about 1480 nm.

16. An optical amplifying system, comprising:
    a pre optical amplifier, used to receive an optical signal and amplify the optical signal with an optical gain by pumping electrons;

a Michelson interferometer (MI), coupled to the pre amplifier so as to filter an amplified spontaneous emission (ASE) noise and allows a construction interference to occur on the optical signal;

a post amplifier, coupled to the MI so as to receive the optical reflected by the MI and performing a post amplification by pumping lower energy electrons to higher energy electrons.

17. The optical amplifying system of claim 16, wherein the MI further comprises:

a 2×2 optical coupler, coupled to the pre amplifier and the post amplifier so as to receive the original optical signal and export the optical signal to the post amplifier after noise filtering and the construction interference; and an optical grating set, comprising at least one first grating and at least one second grating respectively coupled to the optical coupler through a first optical path and a second optical path, wherein the optical coupler divides the optical signal into two portions that are respectively transmitted to the first and second gratings, and the first grating and the second grating comprises a central wavelength substantially equal to an employed wavelength in the system so as to at least filter the ASE noise away and reflect the two portions of the optical signal back to the optical coupler for the construction interference thereon.

18. The optical amplifying system of claim 16, wherein the MI further comprises:

a 2×2 optical coupler, coupled to the pre amplifier and the post amplifier so as to receive the original optical signal and export the optical signal to the post amplifier after noise filtering and the construction interference; and a plurality of pairs of optical grating sets, in which each pair of the optical gratings comprises a first grating and a second grating respectively coupled to the optical coupler through a first optical path and a second optical path, wherein the optical coupler divides the optical signal into two portions that are respectively transmitted to the first and second gratings, and the first grating and the second grating comprises an individual central wavelength for each pair so as to at least filter the ASE noise away and reflect the two portions of the optical signal back to the optical coupler for the construction interference thereon.

19. A semiconductor optical amplifying system, comprising:

a semiconductor substrate;

a pre optical amplifier, located on the semiconductor substrate and used to receive an optical signal and amplify the optical signal with an optical gain by pumping electrons;

a Michelson interferometer (MI), located on the semiconductor substrate and coupled to the pre amplifier so as to filter an amplified spontaneous emission (ASE) noise and allows a construction interference to occur on the optical signal;

a post amplifier, located on the semiconductor and coupled to the MI so as to receive the optical reflected by the MI and performing a post amplification by pumping lower energy electrons to higher energy electrons.

20. The optical amplifying system of claim 19, wherein the MI further comprises:

a 2×2 optical coupler, coupled to the pre amplifier and the post amplifier so as to receive the original optical signal and export the optical signal to the post amplifier after noise filtering and the construction interference; and an optical grating set, comprising at least one first grating and at least one second grating respectively coupled to the optical coupler through a first optical path and a second optical path, wherein the optical coupler divides the optical signal into two portions that are respectively transmitted to the first and second gratings, and the first grating and the second grating comprises a central wavelength substantially equal to an employed wavelength in the system so as to at least filter the ASE noise away and reflect the two portions of the optical signal back to the optical coupler for the construction interference thereon.

21. The optical amplifying system of claim 19, wherein the MI further comprises:

a 2×2 optical coupler, coupled to the pre amplifier and the post amplifier so as to receive the original optical signal and export the optical signal to the post amplifier after noise filtering and the construction interference; and a plurality of pairs of optical grating sets, in which each pair of the optical gratings comprises a first grating and a second grating respectively coupled to the optical coupler through a first optical path and a second optical path, wherein the optical coupler divides the optical signal into two portions that are respectively transmitted to the first and second gratings, and the first grating and the second grating comprises an individual central wavelength for each pair so as to at least filter the ASE noise away and reflect the two portions of the optical signal back to the optical coupler for the construction interference thereon.

* * * * *